(12) United States Patent
Altekruse et al.

(10) Patent No.: US 7,868,588 B2
(45) Date of Patent: Jan. 11, 2011

(54) BATTERY CHARGER WITH WIND TUNNEL COOLING

(75) Inventors: Kenneth Altekruse, Appleton, WI (US);
Jeffrey Lonigro, Appleton, WI (US);
Bernard J. Vogel, Troy, OH (US);
James D. Kimball, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 603 days.

(21) Appl. No.: 11/853,089

(22) Filed: Sep. 11, 2007

(65) Prior Publication Data

US 2009/0066288 A1  Mar. 12, 2009

(51) Int. Cl.
*H02J 7/00* (2006.01)
*H02J 7/14* (2006.01)

(52) U.S. Cl. ....................... 320/109; 320/104
(58) Field of Classification Search ............... 320/104, 320/107, 109
See application file for complete search history.

(56) References Cited

U.S. PATENT DOCUMENTS

| | | | |
|---|---|---|---|
| 3,223,894 A | 12/1965 | Moore | |
| 5,548,200 A | 8/1996 | Nor et al. | |
| 5,598,083 A * | 1/1997 | Gaskins | 414/458 |
| 5,642,260 A | 6/1997 | Sigl | |
| 5,831,240 A | 11/1998 | Katooka et al. | |
| 6,081,423 A | 6/2000 | Griffin | |
| 6,489,591 B1 | 12/2002 | Achtner | |
| 6,495,992 B1 | 12/2002 | Pavlovic | |
| 6,803,746 B2 | 10/2004 | Aker et al. | |
| 6,888,099 B1 | 5/2005 | Schneider | |
| 7,005,608 B2 | 2/2006 | Spear | |
| 7,511,455 B2 * | 3/2009 | Yoneda | 320/112 |
| 2001/0003416 A1 | 6/2001 | Kajiura | |

OTHER PUBLICATIONS

International Search Report; PCT/US2008/072756.

* cited by examiner

*Primary Examiner*—Edward Tso
*Assistant Examiner*—M'Baye Diao
(74) *Attorney, Agent, or Firm*—Quarles & Brady LLP

(57) ABSTRACT

A battery charging system which includes a main housing with a main chamber defined by a base, an end panel mounted on each end of the base, and a cover enclosing the end panels. At least one battery charging connector is connected to the housing. A power supply is connected to the at least one battery charging connector, where the power supply provides a battery charging electrical power to the at least one battery charging connector. The power supply has at least one heat generating electrical device. A tunnel is formed at least partially within the main chamber and extends between the end panels in the main chamber. At least one heat generating electrical device at least partially extends into the tunnel to be exposed to air in the tunnel to cool the heat generating electrical device.

20 Claims, 5 Drawing Sheets

BATTERY CHARGER WITH WIND TUNNEL COOLING

REFERENCE TO RELATED APPLICATIONS

Not applicable.

STATEMENT REGARDING FEDERALLY SPONSORED RESEARCH OR DEVELOPMENT

Not applicable.

FIELD OF THE INVENTION

The present invention relates generally to battery charging systems and, more particularly, to cooling/ventilation systems for fast-charging battery charging systems.

BACKGROUND OF THE INVENTION

Fast-charging, battery charging systems are distinguished from other battery charging systems in that they operate to produce a battery charging output with a higher kilowatt output and approximately twice, or greater, the charging rate than traditional battery charging systems. An industrial-type, fast charging, battery charging system can include a power supply connected to one or more charging stations, and the charging stations can have output currents up to 500 A or greater, and power outputs up to 30 kW and greater. Compatible battery voltages are typically 12 to 80 volts from a lead-acid battery or battery bank. The industrial-type, fast charging, battery chargers can typically be used for charging lift trucks, fork lifts, golf carts, and the like, which chargers operate at relatively higher electrical power levels to charge a 12-80 volts direct current (VDC) battery system. In these systems, the battery is the main power source for driving the fork lift, golf cart, and the like.

These fast charging systems can have a primary side switched-mode power supply that converts a mains alternating current (AC) electrical power into a suitable direct current (DC) electrical power. In general terms, the fast-charging, battery charger, power supply can include input terminals for mains input, and an input rectifier and filter for filtering and rectifying the mains input, an inverter for converting the rectified input power to a higher frequency, a high frequency transformer which converts the voltage up or down to the required output level on its secondary winding(s), and another rectifier and/or filter (output circuit) to provide a suitable DC battery charging power. Mains power can be 120, 240, 480, 600, or higher, VAC, and single phase or multiphase being typical for the higher voltages. A switched-mode power supply has the advantage of providing a relatively high frequency to the transformer, which allows the transformer to be smaller for a given current capacity, as transformer size is inversely related to operating frequency.

Fast-charging, battery charger, power supplies can generally require a number of heat generating electrical devices such as transformers, power modules which may have insulated gate bipolar transistor (IGBT) switching modules, inductors, rectifiers, transducers and the like interconnected through circuit boards, connectors, cables, etc. Because of the high current and/or voltages involved, such power supplies can have electrical devices as mentioned which generate a considerable amount of heat which needs to be dissipated in order to prevent damage to the battery charging power supply, and to increase the reliability of the battery charging power supply. Some of these devices (e.g., transformers) are relatively robust, whereas other (e.g., the integrated circuits used on the power modules and other circuit boards) are susceptible to contaminants and other elements such as static electricity.

For safety and other reasons, fast-charging power supplies include a housing which is generally enclosed, and which restricts natural convection cooling of the electronic components required to transform input energy into a battery charging output. Louvers may be constructed into the housing to accommodate air flow through the housing, and also fans have often been incorporated into the assembly of some the battery charging power supplies to facilitate improved cooling of the electrical components. Such air flow can create the additional problem of introducing heavy particulate flow into the interior of the housing. These particulates can build up on various components, and more particularly the printed circuit boards, and can effectively shorten the useful life or reliability of certain electrical components of the power supply.

Some cooling methods allowed for a cooling flow to follow a labyrinth path through the entire battery charging power supply housing. Although this may improve the cooling of some of the electrical components, it did not address the problem of particulate accumulation on certain electrical components because there was no separation between the cooling flow and the sensitive electrical components. Other methods have increased the complexity of the assembly of the power supply and hinder assembly by preventing assembly of the electrical components of the power supply prior to installation of the electrical assembly within the power supply housing.

What is needed in the art is a system and method capable of separating the electrical components into those that are preferred to be located in a cooling flow from those that are preferred to be located outside a cooling flow while also providing simplified and cost effective assembly processes.

SUMMARY OF THE INVENTION

The invention comprises, in one form thereof, a battery charging system which includes a main housing with a main chamber defined by a base, an end panel mounted on each end of the base, and a cover enclosing the end panels. At least one battery charging connector is connected to the housing. A power supply is connected to the at least one battery charging connector, where the power supply provides a battery charging electrical power to the at least one battery charging connector. The power supply has at least one heat generating electrical device. A tunnel is formed at least partially within the main chamber and extends between the end panels in the main chamber. At least one heat generating electrical device at least partially extends into the tunnel to be exposed to air in the tunnel to cool the heat generating electrical device.

The invention comprises, in another form thereof, a battery charging system with a main housing which has a main chamber defined by a base, an end panel mounted on each end of the base each having an opening therein, and a cover enclosing the end panels. At least one battery charging connector is connected to the housing. A power supply is connected to the battery charging connector(s) to provide a battery charging electrical power, and has at least one heat generating electrical device. A tunnel is formed at least partially within the main chamber and extends between the end panels. At least one heat generating electrical device is arranged in the main chamber at a location outside of the tunnel. At least one heat dissipating device is thermally connected to the at least one heat generating electrical device and is arranged to at least partially extend into an inside of the tunnel.

The invention comprises, in another form thereof, a method of manufacturing a battery charging system which includes the steps of: forming a housing having a main chamber defined by a base, an end panel mounted on each end of the base, and a cover enclosing the end panels; connecting at least one battery charging connector to the housing; connecting a power supply with at least one heat generating electrical device to the at least one battery charging connector to provide a battery charging electrical power to the at least one battery charging connector; forming an inner chamber in the main chamber extending between the end panels to form a tunnel; and mounting the at least one heat generating electrical device to at least partially extend into the tunnel to receive the air flowing through the tunnel to cool the at least one heat generating electrical device.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Figure 1:
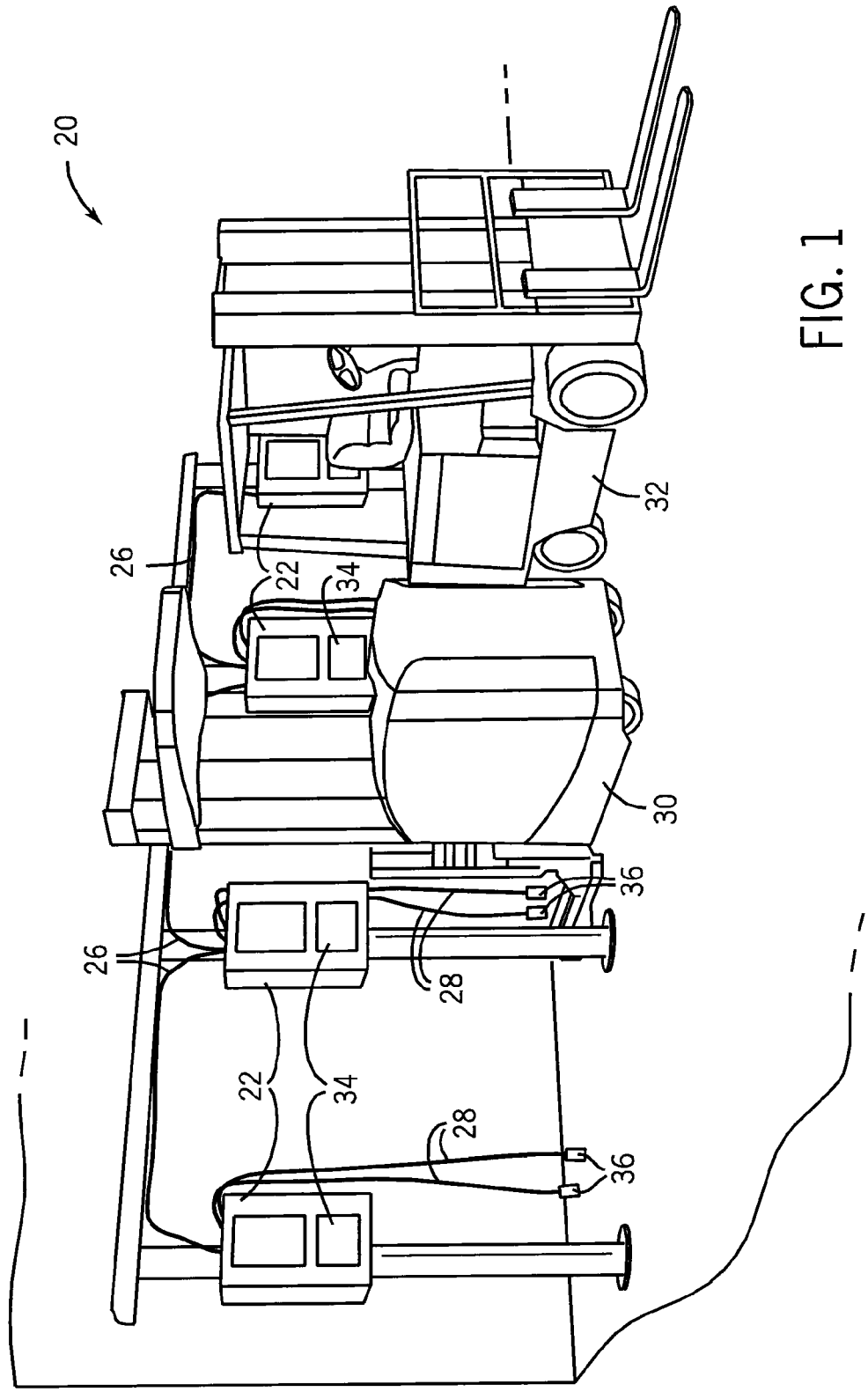
FIG. 1 is a perspective view of an embodiment of a battery charging system according to the present invention, shown with a lift truck and a forklift.
Figure 4:
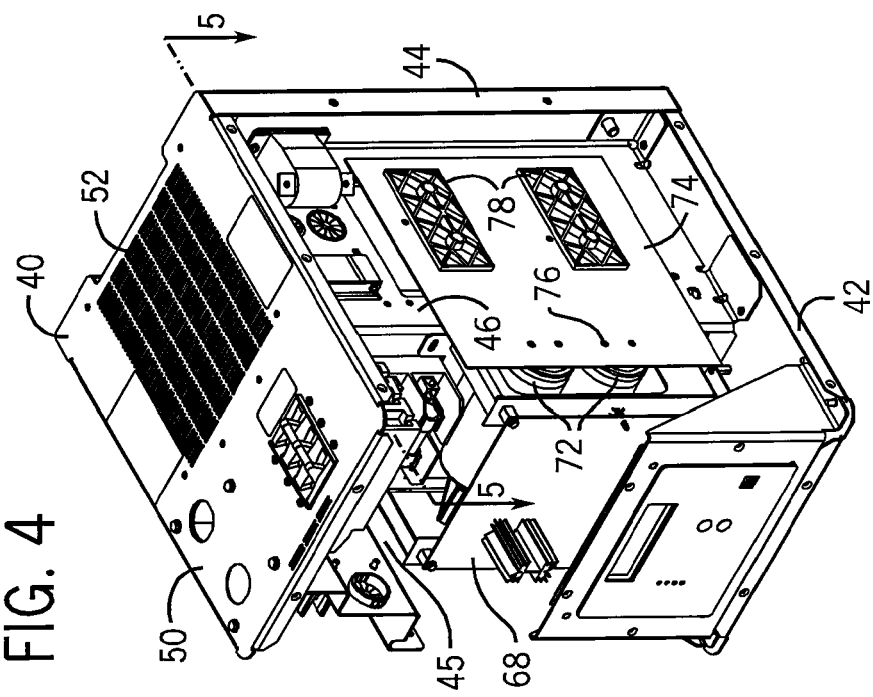
FIG. 4 is a perspective view of the power supply of FIG. 2 with the main housing cover removed.
Figure 2:
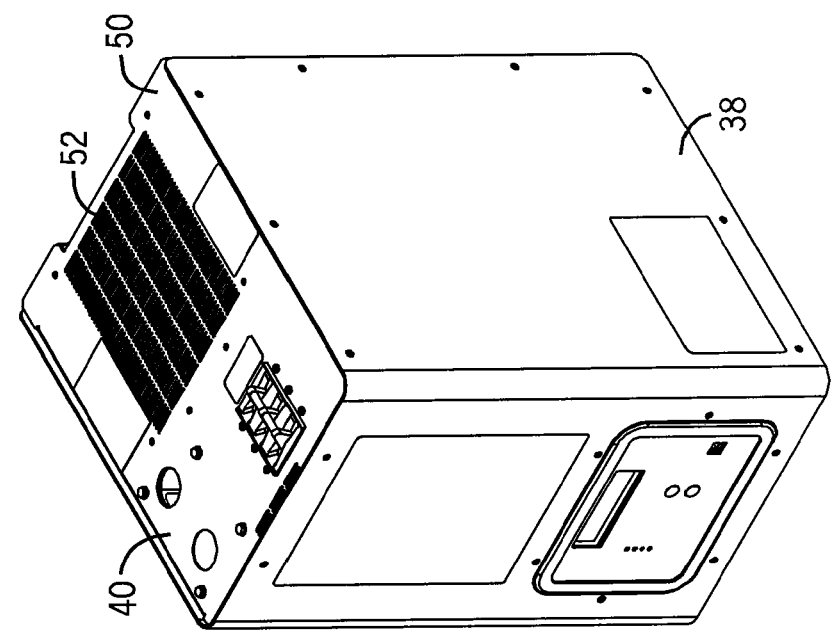
FIG. 2 is a perspective view of the power supply of the battery charging system of FIG. 1.
Figure 3:
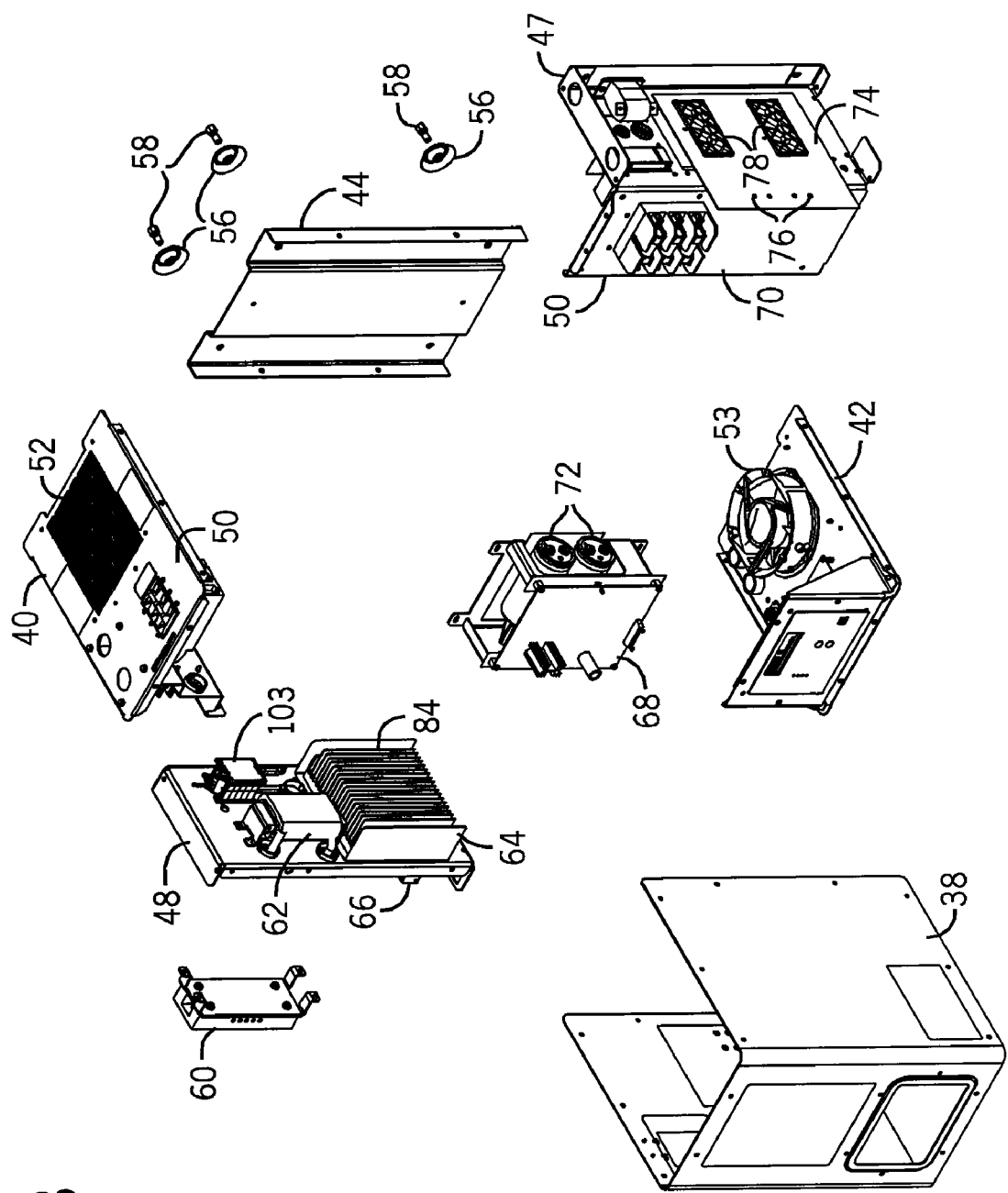
FIG. 3 is an exploded perspective view of the power supply of FIG. 2.

Corresponding reference characters indicate corresponding parts throughout the several views. The exemplifications set out herein illustrate at least one preferred embodiment of the invention, in one form, and such exemplifications are not to be construed as limiting the scope of the invention in any manner.

DETAILED DESCRIPTION OF THE INVENTION

Referring now to the drawings, and more particularly to FIG. 1, a battery charging system 20 includes a plurality of battery-charging, power supplies 22 are interconnected via a series of cables 26 in daisy-chain configuration to share a common input power. While illustrated in a daisy-chain configuration, it is contemplated that the present invention may be utilized in stand-along, battery-charging, power supplies and non-daisy chained configuration. Extending from each battery-charging power supply 22 is a pair of battery-charging cables 28 designed to carry a battery-charging power (such as a DC current at an appropriate battery system voltage) for charging the battery systems of battery-powered systems, such as a lift truck 30, forklift 32, and/or other battery powered vehicles/systems. Battery charging system 20 can also include a battery module (not shown) which is carried by, and is connected to, the battery systems of vehicles 30, 32 and the like, and provides some control and monitoring to assess battery health and the charging process, charging and discharging history, and download capability for these parameters to provide fleet operations data.

Each battery-charging, power supply 22 may include a display 34 that may indicate charge level, charge time, charge voltage, and other relevant parameters of the charging process. Additionally, each battery-charging, power supply 22 may include on/off, and other, controls; short circuit, ground fault, and/or other electrical anomaly sensing circuits; feedback circuits providing feedback from the sensing circuits to the control circuits; bus circuits for receiving the high current signals; and other terminals, connectors, controls and circuits as are known.

Battery-charging cables 28 are designed to connect each battery-charging, power supply 22 via connectors 36 to provide the battery charging power to charge the battery systems of vehicles 30, 32 and the like, or other battery powered systems. Connectors 36 are suitable for connection to the battery systems of vehicles 30, 32.

Referring now to FIGS. 2-5, battery-charging, power supply 22 includes a main housing including a cover 38, ends 40, 42, and base 44, which elements define a main chamber 45 therewithin. A U-shaped assembly 46 having side 47, side 48 and top 50 is connected to ends 40, 42, and base 44. Ends 40, 42 can include louvers 52 and/or a fan 53 to help cool the components of power supply 22. Additionally, and when assembled together, ends 40, 42, base 44, side 47, side 48 and top 50 comprises a wind tunnel 54 on the inside thereof that additionally provides a cooling air flow for various components of power supply 22. Feet 56 connect to base 44 using fasteners 58.

Some of the components of power supply 22 include fuse block 60 for output fuses, and output choke 62. Heat sink 64 is mounted to side 48 and within tunnel 54, and is also connected to output diode rectifier circuit 66 which is mounted to the other side of side 48, outside of tunnel 54. Capacitor module 68 can be mounted on surface 70 of top 50, and capacitors 72 can connect to interconnect circuit board 74 at connectors 76.

Figure 5:
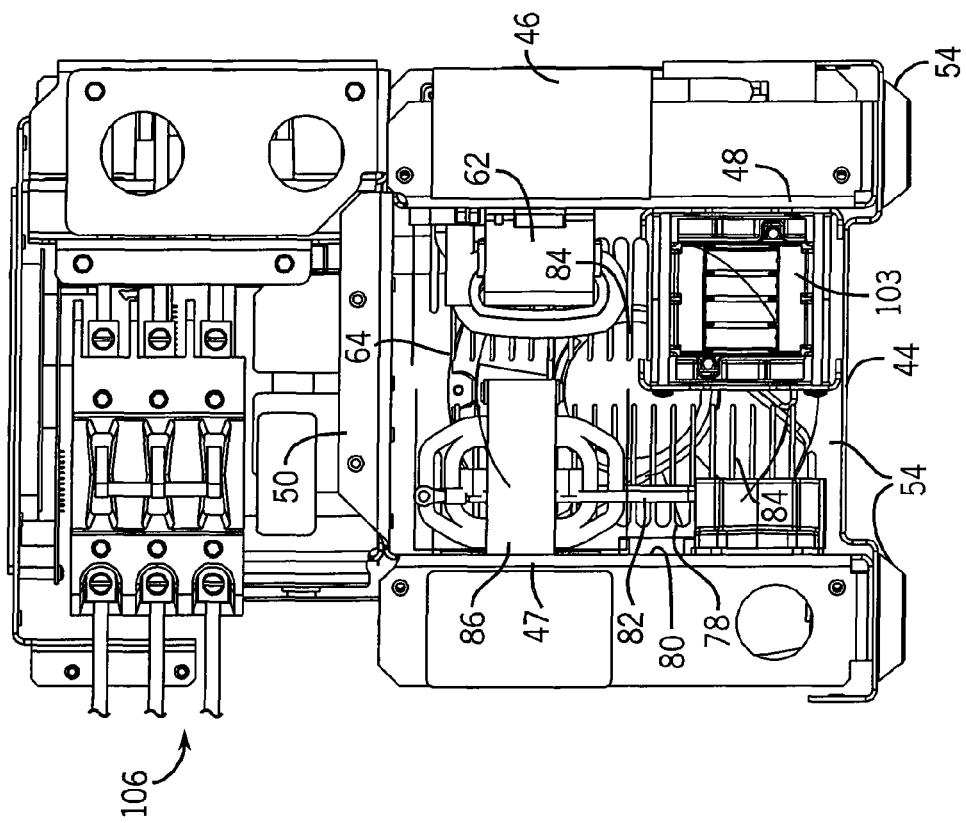
FIG. 5 is a section view taken along section line 5-5 FIG. 2.

Interconnect circuit board 74 can include IGBT, or other, switching power modules 78 which extend through side 47 via one or more slots 80 and connect to heat sink 82 (FIG. 5). Both of heat sinks 64 and 82 draw heat from corresponding heat generating electrical devices 66 and 78, respectively, and then dissipate this heat via fins 84 convectively using the air flow within wind tunnel 54. Other components such as input choke 86, output choke 62 and transformer 103 are mounted directly within wind tunnel 54 for cooling without using heat dissipating devices such as heat sinks 64 and 82.

Figure 6:
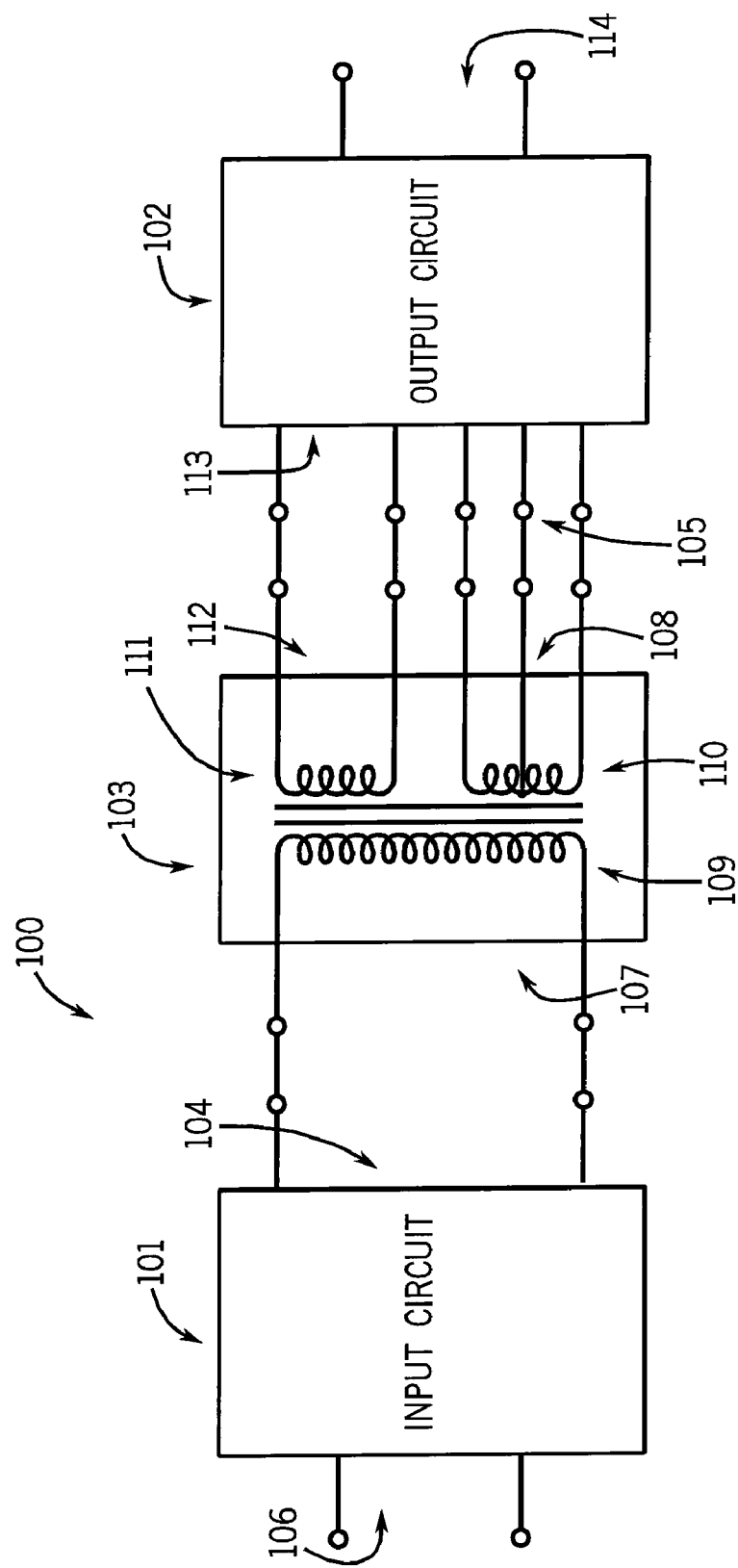
FIG. 6 is a simplified schematic view of the power supply of FIG. 2.

Referring to FIG. 6, these electrical or electronic components can be part of input circuit 101 (FIG. 6) and/or an output circuit 102 as will be discussed below. Specifically, FIG. 6 illustrates an electrical block diagram of at least part of battery-charger, power supply 22 according to one embodiment of the present invention. Power supply 22 includes an input circuit 101, an output circuit 102 and a transformer 103. Transformer 103 is connected between an output 104 of input circuit 101 and inputs 105 and 113 of output circuit 102 in this embodiment. The overall operation of power supplies of the type shown in FIG. 2-6 are well understood by those of ordinary skill in the art.

Generally speaking, input circuit 101 is configured to receive an input signal from an external source of power at its input 106. Input signal and output signal as used herein include voltage signals, current signals, and power signals. Source of power as used herein includes any source of power that can be used by a battery charger-type power supply to obtain a battery charger-type output signal suitable for battery charging, and typically may be a multi-phase, more particularly a three-phase, alternating current power input.

The input signal received at input 106 is processed by the various circuitry of input circuit 101 and the processed signal is provided to transformer 103 at output 104. The output signal from input circuit 101 is received by transformer 103 via its input 107 and transformed to its outputs 108, 112. In one embodiment, transformer 103 includes a primary coil 109 connected to the output 104 of input circuit 101 and a center tapped secondary coil 110 connected to the input 105 of output circuit 102. Secondary coil 110 is disposed inside of transformer 103 to magnetically couple with primary coil 109.

In addition to secondary coil 110, an embodiment can have a boost coil 111 disposed to magnetically couple with primary coil 109. The output 112 of boost coil 111 is provided to output circuit 102 at input 113.

In another embodiment, secondary coil 110 of transformer 103 is not a tapped coil while in other embodiments, secondary coil 103 is tapped at different locations such as quarter tapped or two-thirds tapped. In yet other embodiments, multiple secondary coils are provided such as two, three or four secondary coils, some or all of which may be connected to output circuit 102. In yet another embodiment, coil 109 is the secondary coil and coil 110 is the primary coil.

The output signal from secondary coil 110 is received by output circuit 102 at input 105. The input signal is processed by the various circuitry of output circuit 102 and the processed signal is provided at output 114 as a signal suitable for a battery charging output such as an DC output at approximately the VDC of the battery system which is being charged. In general, the term battery charger-type output denotes an output signal that is suitable for battery charging.

Input circuit as used herein includes any circuit capable of receiving an input signal from a source of power and providing an output signal usable by a transformer. Input circuits can include as part of their circuitry, microprocessors, analog and digital controllers, switches, other transformers, rectifiers, inverters, electrical chokes, converters, choppers, comparators, phased controlled devices, buses, pre-regulators, diodes, inductors, capacitors, resistors, fuses, etc.

Output circuit as used herein includes any circuit capable of receiving an input signal from a transformer and providing an output signal suitable for a desired purpose, such as battery charger-type output signal (e.g., suitable for battery charging. Output circuits can include microprocessors, analog and digital controllers, switches, other transformers, rectifiers, inverters, electrical chokes, converters, choppers, comparators, phased controlled devices, buses, pre-regulators, diodes, inductors, capacitors, resistors, etc.

The present invention therefore provides a system and method capable of separating the electrical components into those that are preferred to be located in a cooling flow from those that are preferred to be located outside a cooling flow while also simplifying the assembly processes, and which can be adapted to a variety of power supply designs for battery charging systems.

While example embodiments and applications of the present invention have been illustrated and described, including a preferred embodiment, it is to be understood that the invention is not limited to the precise configuration and resources described above. Various modifications, changes, and variations apparent to those skilled in the art may be made in the arrangement, operation, and details of the methods and systems of the present invention disclosed herein without departing from the scope of the claimed invention.

We claim:

1. A battery charging system for charging at least one battery of an external battery-powered system, comprising:
   a main housing having a main chamber including a base, an end panel mounted on each end of the base, and a cover enclosing the end panels;
   at least one battery charging connector connected to the housing;
   a power supply connected to the at least one battery charging connector, the power supply being configured to provide a battery charging electrical power to the at least one battery charging connector and thereby charge the at least one battery of the external battery-powered system, the power supply having at least one heat generating electrical device; and
   a tunnel formed at least partially within the main chamber and extending between the end panels in the main chamber, the at least one heat generating electrical device at least partially extending into the tunnel to be exposed to air in the tunnel to cool the at least one heat generating electrical device.

2. The battery charging system of claim 1, wherein the at least one battery charging connector comprises at least one battery cable.

3. The battery charging system of claim 1, further comprising a louver formed in each of the end panels aligned with the tunnel to allow air to flow through the tunnel to cool the at least one heat generating device.

4. The battery charging system of claim 1, further comprising a fan mounted in the tunnel to blow air through the tunnel.

5. The battery charging system of claim 4, wherein the fan is mounted to one of the end panels.

6. The battery charging system of claim 1, wherein the tunnel is formed by a U-shaped assembly mounted to the base and attached about openings formed in the end panels, the U-shaped assembly having two side portions and a top portion to form the tunnel.

7. The battery charging system of claim 6, wherein at least one of the side portions has therein a slot to allow at least one said heat generating electrical device to extend through the U-shaped assembly and into the tunnel to be cooled by air moving between a front panel and a rear panel of the end panels.

8. The battery charging system of claim 1, further including an interconnect circuit board mounted in the main chamber in a spaced relation to said tunnel to isolate said board from heat and air flow through the tunnel.

9. The battery charging system of claim 8, wherein at least one said heat generating electrical device is connected to the interconnect circuit board.

10. The battery charging system of claim 1, further including at least one of an input choke, and output choke and a high frequency transformer mounted within the tunnel.

11. A battery charging system for charging at least one battery of each of a plurality of external battery-powered systems, comprising:
    a plurality of battery charging stations for charging the at least one battery of one of the plurality of external battery-powered systems, each of the plurality of battery charging stations including:
      a main housing having a main chamber defined by a base, an end panel mounted on each end of the base each having an opening therein, and a cover enclosing the end panels;
      at least one battery charging connector connected to the housing;
      a power supply connected to the at least one battery charging connector to provide a battery charging electrical power and thereby charge the at least one battery of the one of the plurality of external battery-powered systems, the power supply having at least one heat generating electrical device;

a tunnel formed at least partially within the main chamber and extending between the end panels, the at least one heat generating electrical device arranged in the main chamber at a location outside of the tunnel;

at least one heat dissipating device thermally connected to the at least one heat generating electrical device and arranged to at least partially extend into an inside of the tunnel; and at least one cable connecting the plurality of battery charging stations to deliver an input power to the plurality of battery charging stations.

12. The battery charging system of claim 11, wherein the at least one battery charging connector comprising at least one battery cable.

13. The battery charging system of claim 11, wherein at least one opening comprises a louver formed in each of the end panels and aligned with the tunnel to allow air to flow through the tunnel to cool the at least one heat dissipating device.

14. The battery charging system of claim 11, further comprising a fan mounted in the tunnel for blowing air through the tunnel.

15. The battery charging system of claim 14, wherein the fan is mounted to one of the end panels.

16. The battery charging system of claim 11, wherein the tunnel is formed by a U-shaped assembly mounted to the base and attached about openings formed in the end panels, the U-shaped assembly having two side portions and a top portion to form the tunnel.

17. The battery charging system of claim 16, wherein at least one of the side portions has therein a slot to allow at least one said heat generating electrical device to extend through the U-shaped assembly and into the tunnel to be cooled by air moving between the end panels.

18. The battery charging system of claim 11, further including an interconnect circuit board mounted in the main chamber in a spaced relation to said tunnel to isolate said board from heat and air flow through the tunnel.

19. The battery charging system of claim 18, wherein at least one said heat generating electrical device is connected to the interconnect circuit board.

20. A method of manufacturing a battery charging system for charging at least one battery of an external battery-powered system, comprising the steps of:

forming a housing having a main chamber defined by a base, an end panel mounted on each end of the base, and a cover enclosing the end panels;

connecting at least one battery charging connector to the housing;

connecting a power supply having at least one heat generating electrical device to the at least one battery charging connector to provide a battery charging electrical power to the at least one battery charging connector to thereby charge the at least one battery of the external battery-powered system;

forming an inner chamber in the main chamber extending between the end panels to form a tunnel; and mounting the at least one heat generating electrical device to at least partially extend into the tunnel to receive the air flowing through the tunnel to cool the at least one heat generating electrical device.

\* \* \* \* \*